(12) United States Patent
Racanelli et al.

(10) Patent No.: US 7,078,786 B1
(45) Date of Patent: Jul. 18, 2006

(54) COMPOSITE SERIES RESISTOR HAVING REDUCED TEMPERATURE SENSITIVITY IN AN IC CHIP

(75) Inventors: Marco Racanelli, Santa Ana, CA (US); Chun Hu, Irvine, CA (US); Chih-Chieh Shen, Irvine, CA (US)

(73) Assignee: Newport Fab, LLC dba Jazz Semiconductor, Newport Beach, CA (US)

( * ) Notice: Subject to any disclaimer, the term of this patent is extended or adjusted under 35 U.S.C. 154(b) by 132 days.

(21) Appl. No.: 10/843,190

(22) Filed: May 10, 2004

Related U.S. Application Data

(62) Division of application No. 10/272,888, filed on Oct. 16, 2002, now Pat. No. 6,759,729.

(51) Int. Cl.
*H01L 29/00* (2006.01)

(52) U.S. Cl. .................. 257/536; 257/537; 257/538

(58) Field of Classification Search .............. 257/538
See application file for complete search history.

(56) References Cited

U.S. PATENT DOCUMENTS

| | | | |
|---|---|---|---|
| 5,883,417 A * | 3/1999 | Jao et al. ................. 257/377 |
| 6,291,873 B1 * | 9/2001 | Hidaka ..................... 257/539 |
| 6,504,220 B1 * | 1/2003 | Sato ......................... 257/380 |
| 6,849,921 B1 * | 2/2005 | Uenishi ..................... 257/536 |
| 2004/0004535 A1 * | 1/2004 | Banerjee ................... 338/309 |

* cited by examiner

*Primary Examiner*—Wael Fahmy
*Assistant Examiner*—Mursalin B. Hafiz
(74) *Attorney, Agent, or Firm*—Farjami & Farjami LLP

(57) ABSTRACT

According to one exemplary embodiment, an integrated circuit chip comprises an oxide region. The integrated circuit chip further comprises a poly resistor having a first terminal and second terminal, where the poly resistor is situated over the oxide region. According to this exemplary embodiment, the integrated circuit chip further comprises a metal resistor having a first terminal and a second terminal, where the metal resistor is situated over the poly resistor, and where the first terminal of the metal resistor is connected to the first terminal of the poly resistor. According to this exemplary embodiment, the integrated circuit chip may further comprise a first metal segment connected to the second terminal of the metal resistor and a second metal segment connected to the second terminal of the poly resistor. The integrated circuit chip may further comprise an inter-layer dielectric situated between the poly resistor and the metal resistor.

11 Claims, 3 Drawing Sheets

COMPOSITE SERIES RESISTOR HAVING REDUCED TEMPERATURE SENSITIVITY IN AN IC CHIP

This is a divisional of application Ser. No. 10/272,888 filed Oct. 16, 2002 now U.S. Pat. No. 6,759,729.

BACKGROUND OF THE INVENTION

1. Field of the Invention

The present invention is in the field of fabrication of semiconductor devices. More specifically, the invention is in the field of fabrication of resistors for integrated circuits.

2. Related Art

The integrated circuit ("IC") chips in modern electronic devices include circuits, such as mixed signal circuits, RF circuits, and power amplifier circuits, that require accurate and stable voltages to operate properly. For example, a change in reference voltage can cause the bias voltage in a power amplifier circuit to change, which may result in undesirable distortion in an output signal of the power amplifier circuit. To obtain stable voltages, the circuits in an IC chip, in turn, require components, such as resistors, that remain stable under diverse operating conditions. Furthermore, the circuits in an IC chip require voltages that remain stable while the IC chip is operating in varying ambient or junction temperatures. Thus, semiconductor manufacturers are challenged to fabricate resistors that provide stable resistance values under varying temperatures.

In a conventional IC chip, polysilicon ("poly") resistors are commonly used, and may be fabricated using metal oxide semiconductor ("MOS") technology. For example, a polysilicon resistor may be fabricated by depositing a polysilicon film on a field oxide region in the IC chip. The polysilicon film may be deposited, for example, using a low-pressure chemical vapor deposition ("LPCVD") process. The deposited polysilicon film may then be patterned and etched to form a resistor. The resulting poly resistor has a negative temperature coefficient, which means that the resistance of the poly resistor will decrease in value as temperature increases. A poly resistor, for example, may have a temperature coefficient of approximately −300.0 parts per million ("ppm")/° C.

The temperature coefficient of the poly resistor, and thus the sensitivity of the resistance of the poly resistor to temperature variations, may be reduced by increasing the size of the poly resistor. For example, a poly resistor having a width of 2.0 microns and a length of 10.0 microns may have a temperature coefficient equal to approximately −350.0 ppm/° C. By increasing the width and length, respectively, of the poly resistor to 4.0 microns and 20.0 microns, for example, the temperature coefficient of the poly resistor may be reduced to approximately −200.0 ppm/° C. Although increasing the size of the poly resistor reduces the sensitivity of the poly resistor to temperature variations, it also results in an undesirable consumption of space in the IC chip.

Metal resistors are also utilized by semiconductor manufacturers in IC chips to provide stable resistances and thus, accurate operating voltages, such as reference and bias voltages. Conventional metal resistors typically have a positive temperature coefficient, which causes an increase in resistance as temperature increases. Similar to poly resistors, metal resistors may also be increased in size to reduce their temperature sensitivity. However, as with poly resistors, increasing the size of the metal resistor also results in an undesirable consumption of space in the IC chip.

Thus, there is a need in the art for a resistor that achieves a stable resistance under varying temperature conditions without consuming additional space in an IC chip.

SUMMARY OF THE INVENTION

The present invention is directed to a temperature insensitive resistor in an IC chip. The present invention addresses and resolves the need in the art for a resistor that achieves a stable resistance under varying temperature conditions without consuming additional space in an IC chip.

According to one exemplary embodiment, an integrated circuit chip comprises an oxide region. The oxide region, for example, may be a field oxide region. The integrated circuit chip further comprises a poly resistor having a first terminal and second terminal, where the poly resistor is situated over the oxide region. The poly resistor, for example, may be P-type polycrystalline silicon and may have a temperature coefficient approximately equal to −350.0 ppm/° C.

According to this exemplary embodiment, the integrated circuit chip further comprises a metal resistor having a first terminal and a second terminal, where the metal resistor is situated over the poly resistor, and where the first terminal of the metal resistor is connected to the first terminal of the poly resistor. The metal resistor, for example, may be titanium nitride and may have a temperature coefficient approximately equal to 400.0 ppm/° C. The metal resistor may be situated, for example, in a first metal level of the integrated circuit chip.

According to this exemplary embodiment, the integrated circuit chip may further comprise a first metal segment connected to the second terminal of the metal resistor and a second metal segment connected to the second terminal of the poly resistor. The first and second metal segments may be situated, for example, in a second metal level of the integrated circuit chip. The integrated circuit chip may further comprise an inter-layer dielectric situated between the poly resistor and the metal resistor. Other features and advantages of the present invention will become more readily apparent to those of ordinary skill in the art after reviewing the following detailed description and accompanying drawings.

DETAILED DESCRIPTION OF THE INVENTION

The present invention is directed to a temperature insensitive resistor in an IC chip. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
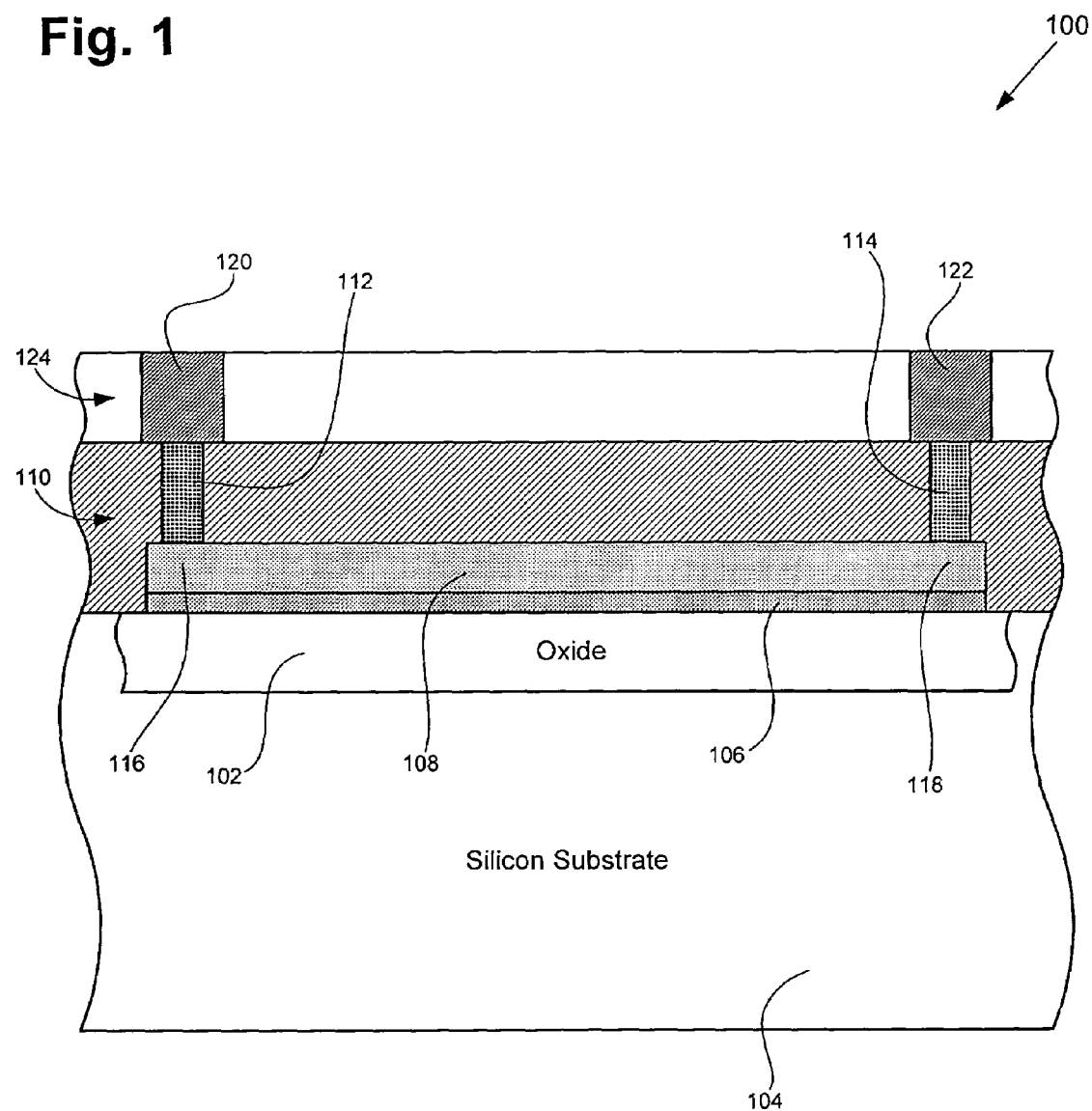
FIG. 1 illustrates a cross sectional view of a portion of an IC chip, including a conventional exemplary polysilicon resistor.

FIG. 1 shows a cross sectional view of a portion of an IC containing a conventional exemplary polysilicon ("poly") resistor. Structure 100 includes oxide region 102, which may comprise silicon dioxide, a low-k dielectric, or other suitable dielectric material, and is formed in a manner known in the art. Oxide region 102 provides electrical isolation from other devices on silicon substrate 104 in a manner known in the art. Oxide region 102 can also be other forms of isolation, for example local oxidation of silicon ("LOCOS") or shallow trench isolation oxide ("STI").

As shown in FIG. 1, intermediate dielectric layer 106 is situated on oxide region 102 and may comprise a thin layer of silicon dioxide or a suitable dielectric with a low dielectric constant, i.e. a low-k dielectric. Intermediate dielectric layer 106 may be deposited over oxide region 102, for example, using a chemical vapor deposition ("CVD") process. Further shown in FIG. 1, conventional poly resistor 108 is situated on intermediate dielectric layer 106. Conventional poly resistor 108 may be formed by depositing, patterning, and etching P-type polycrystalline silicon material in a manner known in the art. The P-type polycrystalline silicon material might be deposited, for example, in a low pressure chemical vapor deposition ("LPCVD") process.

Also shown in FIG. 1, inter-layer dielectric 110 is situated over conventional poly resistor 108. Inter-layer dielectric 110 may be formed by depositing a layer of silicon dioxide or a low-k dielectric over poly resistor 108 using, for example, a CVD process as known in the art. Further shown in FIG. 1, contacts 112 and 114, respectively, are situated in inter-layer dielectric 110 on terminals 116 and 118 of poly resistor 108. Contacts 112 and 114 can comprise an electrically conductive material, such as tungsten, and may be formed in a manner known in the art.

As shown in FIG. 1, metal segments 120 and 122, respectively, are situated in metal level 124 over contacts 112 and 114. Metal level 124 may be, for example, a first metal level in the IC chip. Metal segments 120 and 122 may comprise copper, a "metal stack" which uses aluminum as the primary metal in the stack, or other suitable metal. Metal segments 120 and 122 may be formed by patterning and etching an interconnect metal layer in a manner known in the art. Metal segments 120 and 122, respectively, are electrically connected to terminals 116 and 118 of conventional poly resistor 108 by contacts 112 and 114.

Conventional poly resistor 108 in FIG. 1 has a negative temperature coefficient, which results in a decrease in resistance of conventional poly resistor 108 as temperature increases. By increasing the width and length of conventional poly resistor 108, the negative temperature coefficient can be reduced such that the resistance of conventional poly resistor 108 is less sensitive to temperature change. For example, for a length of 10.0 microns and a width of 2.0 microns, conventional poly resistor 108 may have a temperature coefficient of approximately $-350.0$ ppm/° C. However, by increasing the length to 20.0 microns and the width to 4.0 microns, for example, the temperature coefficient of conventional poly resistor 108 may be reduced to approximately $-200.0$ ppm/° C. Thus, by increasing the area of poly resistor 108, the sensitivity of the resistance of conventional poly resistor 108 to temperature variations can be reduced. However, as stated above, the area consumed by the resistor is significantly and undesirably increased. Moreover, despite the reduction of the temperature coefficient, it (i.e., the temperature coefficient) still remains at a value substantially greater than zero.

Figure 2A:
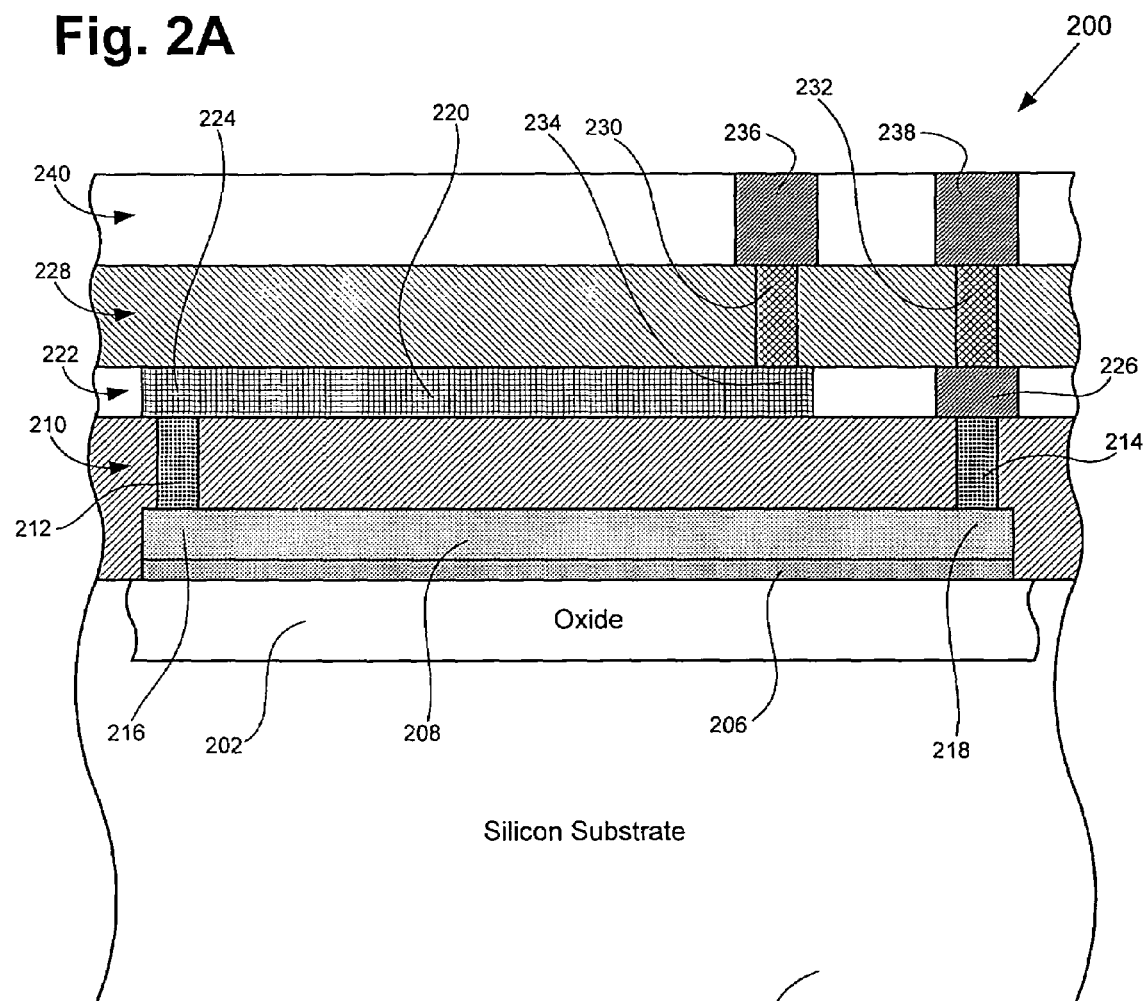
FIG. 2A illustrates a cross sectional view of a portion of an IC chip, including an exemplary composite series resistor in accordance with one embodiment of the present invention.

FIG. 2A shows a cross sectional view of a portion of an IC chip comprising an exemplary composite resistor comprising a poly resistor connected in series with a metal resistor in accordance with one embodiment of the present invention. Structure 200 includes oxide region 202, which may comprise silicon dioxide, tetraethylorthosilicate ("TEOS") oxide, a low-k dielectric, or other suitable dielectric material, and is formed in a manner known in the art. Oxide region 202 provides electrical isolation from other devices on silicon substrate 204. In one embodiment, oxide region 202 may be a field oxide region comprising silicon dioxide. Oxide region 202 can also be other forms of isolation, such as LOCOS, i.e. local oxidation of silicon, or STI, i.e. shallow trench isolation.

As shown in FIG. 2A, intermediate dielectric layer 206 is situated on oxide region 202 and can comprise a thin layer of silicon dioxide or other suitable dielectric with a low dielectric constant, i.e. a low-k dielectric. Intermediate dielectric layer 206 may be deposited over oxide region 202 using, for example, using a CVD process. Further shown in FIG. 2A, poly resistor 208 is situated on intermediate dielectric layer 206. Poly resistor 208 can comprise P-type polycrystalline silicon. In one embodiment, poly resistor 208 may be formed by depositing, patterning, and etching P-type polycrystalline silicon material in a manner known in the art. P-type polycrystalline silicon may be formed, for example, by doping polycrystalline silicon with boron or other suitable P-type dopant and may be deposited, for example, in a LPCVD or reduced pressure chemical vapor deposition ("RPCVD") process. As stated above, a P-type poly resistor 208 has a negative temperature coefficient, which results in a decrease in resistance of poly resistor 208 as temperature increases. The temperature coefficient of poly resistor 208 is determined by, among other things, the size of poly resistor 208 and the material poly resistor 208 comprises. By way of an example, if poly resistor 208 has a width of approximately 2.0 microns and a length of approximately 10.0 microns and comprises P-type polycrystalline silicon, the temperature coefficient of poly resistor 208 may be approximately equal to $-350.0$ ppm/° C.

Also shown in FIG. 2A, inter-layer dielectric 210 is situated over poly resistor 208. Inter-layer dielectric 210 may be formed by depositing a layer of silicon dioxide or a suitable dielectric with a low dielectric constant, i.e. a low-k dielectric, over poly resistor 208 using, for example, a CVD process. Further shown in FIG. 2A, contacts 212 and 214, respectively, are situated in inter-layer dielectric 210 over terminals 216 and 218 of poly resistor 208. Contacts 212 and 214 can comprise tungsten or another suitable electrically conductive material, and may be formed in a manner known in the art.

As shown in FIG. 2A, metal resistor 220 is situated over inter-layer dielectric 210 in metal level 222. In the present embodiment, metal level 222 can be a first metal level in an IC chip. In other embodiments, metal level 222 may be a second, third, or higher metal level in an IC chip. In one embodiment, metal resistor 220 may be formed in a layer situated between interconnect metal levels in an IC chip. In the present embodiment, metal resistor 220 can comprise titanium nitride ("TiN"). In other embodiments, metal resistor 220 may comprise titanium nitride tungsten ("TiNW"), titanium tungsten ("TiW"), or other suitable resistive metal-based material.

Metal resistor 220 may be formed, for example, by depositing, patterning, and etching a layer of resistive metal-based material, such as titanium nitride, in a manner known in the art. The layer of resistive metal-based material may be deposited using, for example, physical vapor deposition ("PVD") or CVD techniques. Metal resistor 220 has a positive temperature coefficient, which results in an increase in resistance of metal resistor 220 as temperature increases. The temperature coefficient of metal resistor 220 may be, for example, approximately equal to 400.0 ppm/° C. The temperature coefficient of metal resistor 220 may be reduced by increasing the size of metal resistor 220.

Also shown in FIG. 2A, terminal 224 of metal resistor 220 is situated over contact 212. Contact 212 provides electrical connectivity between terminal 224 of metal resistor 220 and terminal 216 of poly resistor 208, and thus contact 212 connects metal resistor 220 in series with poly resistor 208. The combination of metal resistor 220 connected in series with poly resistor 208 is also referred to as a "composite series resistor" in the present application. Further shown in FIG. 2A, metal segment 226 is situated in metal level 222 over contact 214. Thus, contact 214 provides electrical connectivity between terminal 218 of poly resistor 208 and metal segment 226. Metal segment 226 may comprise copper, a "metal stack" which uses aluminum as the primary metal in the stack, or other suitable metal. Metal segment 226 may be formed by depositing, patterning, and etching a layer of interconnect metal in a manner known in the art.

As shown in FIG. 2A, inter-layer dielectric 228 is situated over metal level 222. Inter-layer dielectric 228 may be formed by depositing a layer of silicon dioxide or a suitable dielectric with a low dielectric constant, i.e. a low-k dielectric, over metal resistor 220 and metal segment 226 using, for example, a CVD process. Also shown in FIG. 2A, vias 230 and 232 are situated in inter-layer dielectric 228. In particular, via 230 is situated over terminal 234 of metal resistor 220 and via 232 is situated over metal segment 226. Vias 230 and 232 may be formed by etching inter-layer dielectric 228 by a standard via etch process. Vias 230 and 232 may be filled by using a fill comprised of a suitable electrically conducting material, such as copper.

Further shown in FIG. 2A, metal segments 236 and 238, respectively, are situated in metal level 240 over vias 230 and 232. In the present embodiment, metal level 240 can be a second metal level in an IC chip. In other embodiments, metal level 240 may be a third, fourth, or higher metal level in an IC chip. Metal segments 236 and 238 may comprise copper, a "metal stack" which uses aluminum as the primary metal in the stack, or other suitable metal. Metal segments 236 and 238 may be formed by depositing, patterning, and etching a layer of interconnect metal in a manner known in the art. Metal segments 236 and 238, respectively, are electrically connected to terminal 234 of metal resistor 220 and metal segment 226 by vias 230 and 232. Metal segment 238 is also electrically connected to terminal 218 of poly resistor 208 through via 232, metal segment 226, and contact 214.

It is noted that terminals 218 and 234 comprise the two terminals of the invention's composite series resistor, which in the present embodiment includes metal resistor 220 in series with poly resistor 208. As stated above, metal segments 236 and 238, respectively, are connected to terminals 234 and 218 of the invention's composite series resistor. In the present embodiment, metal segments 236 and 238 are situated in the same metal level, i.e. metal level 240, of an IC chip. In one embodiment, metal segments 236 may be situated in different metal level of an IC chip than metal segment 238. For example, metal segment 236 may be situated in metal level two and metal segment 238 may be situated in metal level three.

Thus, by forming a composite resistor comprising a poly resistor, i.e. P-type poly resistor 208, having a negative temperature coefficient, in series with a metal resistor, i.e. metal resistor 220, having a positive temperature coefficient, the present invention advantageously achieves a composite series resistor having significantly reduced temperature sensitivity. Furthermore, since metal resistor 220 is formed in a metal level or other intermediate layer of an IC chip and poly resistor 208 is formed over oxide region 202, metal resistor 220 and poly resistor 208 are formed on different layers of the IC chip. Thus, the present invention advantageously achieves a composite series resistor that achieves reduced temperature sensitivity without consuming additional area in the IC chip. Moreover, the present invention achieves a composite series resistor having significantly reduced temperature sensitivity without an undesirable increase in the size of either poly resistor 208 or metal resistor 220. In contrast, conventional exemplary poly resistor 108 in FIG. 1 is fabricated on a single layer of an IC chip. To provide a decrease in negative temperature coefficient, conventional exemplary poly resistor 108 must be increased in size, and thus will undesirably consume more area of the IC chip.

Figure 2B:
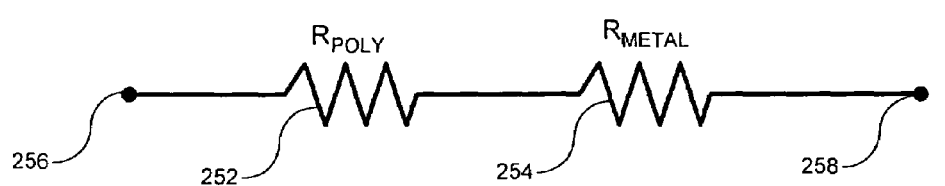
FIG. 2B illustrates a schematic diagram of an exemplary composite series resistor in accordance with one embodiment of the present invention.

FIG. 2B shows a schematic diagram of an exemplary composite series resistor in accordance with one embodiment of the present invention. Composite series resistor 250 in FIG. 2B includes P-type poly resistor 252 connected in series with metal resistor 254. Poly resistor 252 corresponds to poly resistor 208 in FIG. 2A and metal resistor 254 corresponds to metal resistor 220 in FIG. 2A. As shown in FIG. 2B, composite series resistor 250 also includes terminals 256 and 258.

The resistance of composite series resistor 250 is equal to the sum of the resistance of poly resistor 252 and the resistance of metal resistor 254. The resistance of a resistor, in general, is determined by the equation:

$$R(T) = R(T_0)*(1 + \text{Coeff.}*\Delta T) \qquad \text{equation (1)}$$

where "R(T)" is the resistance of the resistor at current temperature "T," "R(T$_0$)" is the resistance of the resistor at reference temperature "T$_0$," and "Coeff." is temperature coefficient of the resistor, while "ΔT" is the difference between the current temperature "T" and the reference temperature "T$_0$."

Thus, utilizing equation (1), the resistance of poly resistor 252 is determined by the equation:

$$R_{poly}(T) = R_{poly}(T_0)*(1 + \text{Coeff}_{poly}*\Delta T) \qquad \text{equation (2)}$$

where "R$_{poly}$(T)" is the resistance of poly resistor 252 at current temperature "T," "R$_{poly}$(T$_0$)" is the resistance of poly resistor 252 at temperature "$T_0$," and "$\text{Coeff}_{poly}$" is the temperature coefficient of poly resistor 252. Similarly, the resistance of metal resistor 254 is determined by the equation:

$$R_{metal}(T)=R_{metal}(T_0)*(1+\text{Coeff}_{metal}*\Delta T) \quad \text{equation (3)}$$

where "$R_{metal}(T)$" is the resistance of metal resistor 254 at current temperature "T," "$R_{metal}(T_0)$" is the resistance of metal resistor 254 at temperature "$T_0$," and "$\text{Coeff}_{metal}$" is the temperature coefficient of metal resistor 254.

Thus, the resistance of the present invention's composite series resistor 250 is determined by adding equations (2) and (3) to form the equation:

$$R_{poly}(T)+R_{metal}(T)=R_{poly}(T_0)+R_{poly}(T_0)* \\ (\text{Coeff}_{poly}*\Delta T)+R_{metal}(T_0)+R_{metal}(T_0)* \\ (\text{Coeff}_{metal}*\Delta T) \quad \text{equation (4)}.$$

To convey the meaning of the above equation, it (i.e., equation (4)) can be simplified by assuming that both $R_{poly}(T_0)$ and $R_{metal}(T_0)$ are selected to have the same resistance "R." In that case, equation (4) may be simplified to form the equation:

$$R_{poly}(T)+R_{metal}(T)=2R+R(\Delta T)*(\text{Coeff}_{poly}+\text{Coeff}_{metal}) \quad \text{equation (5)}.$$

By fabricating poly resistor 252 and metal resistor 254 such that "$\text{Coeff}_{poly}$" is approximately equal and opposite in sign to "$\text{Coeff}_{metal}$," the term "$R(\Delta T)*(\text{Coeff}_{poly}+\text{Coeff}_{metal})$" in equation (5) can be reduced to a minimal. As a result, the difference between a resistance of composite series resistor 250 at temperature "T" and a resistance of composite series resistor 250 at temperature "$T_0$" can be significantly reduced. Thus, the present invention advantageously achieves a composite series resistor having a resistance with a significantly minimized sensitivity to temperature variations.

Figure 3A:
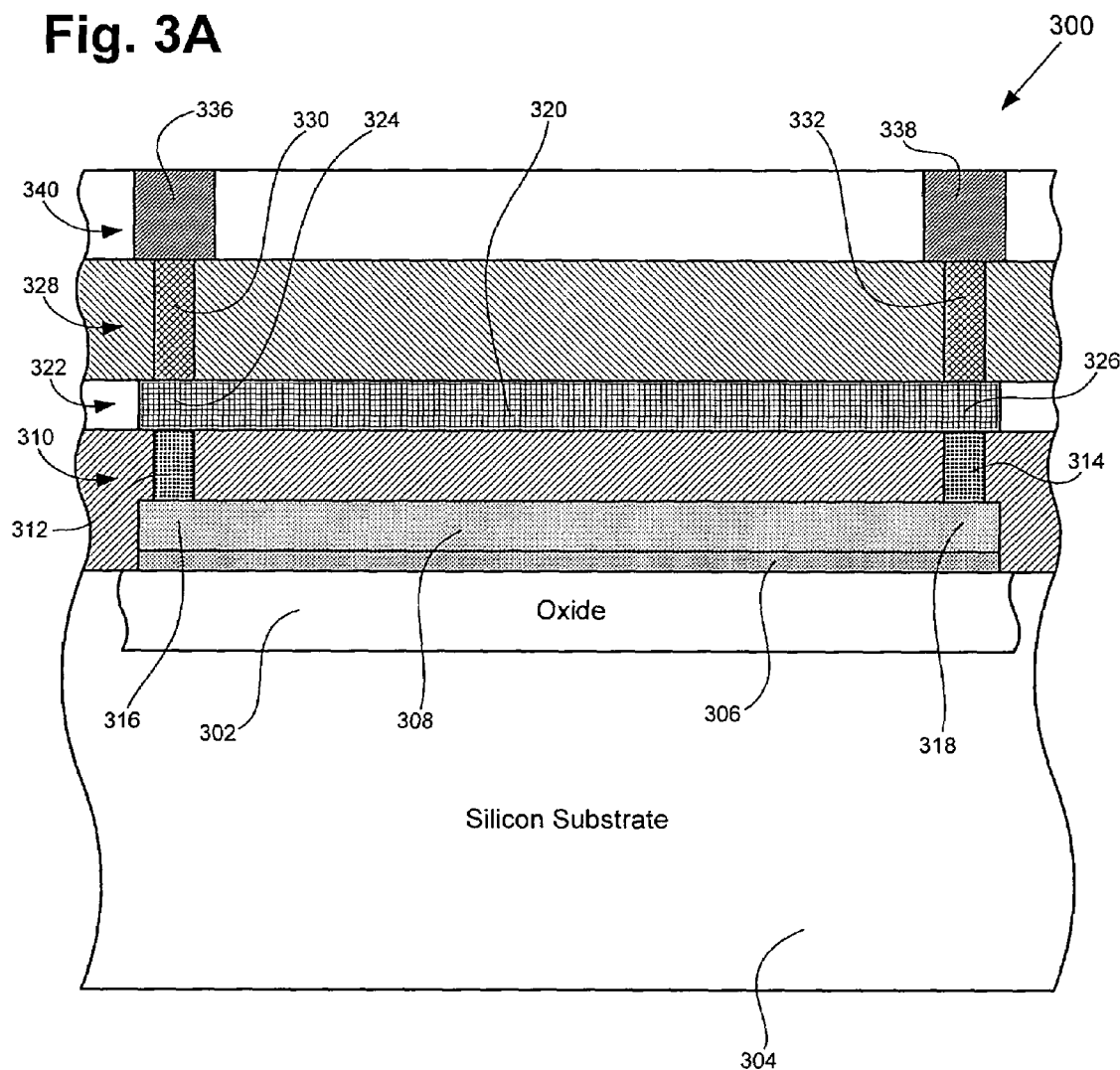
FIG. 3A illustrates a cross sectional view of a portion of an IC chip, including an exemplary composite parallel resistor in accordance with one embodiment of the present invention.

FIG. 3A shows a cross sectional view of a portion of an IC chip which includes an exemplary composite resistor comprising a poly resistor connected in parallel with a metal resistor in accordance with one embodiment of the present invention. Structure 300 includes oxide region 302, which is formed in a similar manner and generally comprises the same material as oxide region 202 in structure 200 in FIG. 2A. Also shown in FIG. 3A, silicon substrate 304 is similar to silicon substrate 204 in FIG. 2A.

As shown in FIG. 3A, intermediate dielectric layer 306 is situated on oxide region 302. Intermediate dielectric layer 306 is formed in a similar in a similar manner and generally comprises the same material as dielectric layer 206 in structure 200 in FIG. 2A. Also shown in FIG. 3A, poly resistor 308 is situated on intermediate dielectric layer 306. Poly resistor 308 is formed in a similar manner and generally comprises the same material as poly resistor 208 in structure 200 in FIG. 2A. Further shown in FIG. 3A, inter-layer dielectric 310 is situated over poly resistor 308. Inter-layer dielectric 310 is formed in a similar manner and generally comprises the same material as inter-layer dielectric 210 in structure 200 in FIG. 2A.

Also shown in FIG. 3A, contacts 312 and 314, respectively, are situated in inter-layer dielectric 310 over terminals 316 and 318 of poly resistor 308. Contacts 312 and 314 can comprise tungsten or another suitable electrically conducting material, and may be formed in a manner known in the art. As shown in FIG. 3A, metal resistor 320 is situated over inter-layer dielectric 310 in metal level 322. In the present embodiment, metal level 322 can be a first metal level in an IC chip. In other embodiments, metal level 322 may be a second, third, or higher metal level in an IC chip.

In one embodiment, metal resistor 320 may be formed on a metal layer situated between interconnect metal levels in an IC chip. Metal resistor 320 is formed in a similar manner and generally comprises the same material as metal resistor 220 in structure 200 in FIG. 2A.

Further shown in FIG. 3A, terminals 324 and 326 of metal resistor 320 are situated over contacts 312 and 314, respectively. Contacts 312 and 314 provide electrical connectivity between terminals 324 and 326 of metal resistor 320 and terminals 316 and 318, respectively, of poly resistor 308, and thus contacts 312 and 314 connect metal resistor 320 in parallel with poly resistor 308. The combination of metal resistor 320 connected in parallel with poly resistor 308 is also referred to as a "composite parallel resistor" in the present application.

As shown in FIG. 3A, inter-layer dielectric 328 is situated over metal resistor 320. Inter-layer dielectric 328 is formed in a similar manner and generally comprises the same material as inter-layer dielectric 228 in structure 200 in FIG. 2A. Also shown in FIG. 3A, vias 330 and 332 are situated in inter-layer dielectric over terminals 324 and 326, respectively, of metal resistor 320. Vias 330 and 332 may be formed by etching inter-layer dielectric 328 by a standard etch process and may be filled by using a fill comprised of a suitable electrically conducting material, such as tungsten.

Further shown in FIG. 3A, metal segments 336 and 338, respectively, are situated in metal level 340 over vias 330 and 332. In the present embodiment, metal level 340 can be a second metal level in an IC chip. In other embodiments, metal level 340 may be a third, fourth, or higher metal level in an IC chip. Metal segments 336 and 338 are formed in a similar manner and generally comprises the same material as metal segments 236 and 238 in structure 200 in FIG. 2A. Metal segments 336 and 338, respectively, are electrically connected to terminals 324 and 326 of metal resistor 320 by vias 330 and 332. In the present embodiment, metal segments 336 and 338 are situated in the same metal level, i.e. metal level 340, of an IC chip. In one embodiment, metal segment 336 may be situated in a different metal level of an IC chip than metal segment 338.

Thus, similar to the invention's composite series resistor discussed above, the present invention achieves a composite parallel resistor, i.e. poly resistor 308 in parallel with metal resistor 320, having significantly reduced temperature sensitivity. Also, similar to the invention's composite series resistor discussed above, the invention's composite parallel resistor advantageously achieves reduced temperature sensitivity without consuming additional area in the IC chip and without increasing the size of poly resistor 308 or metal resistor 320.

Figure 3B:
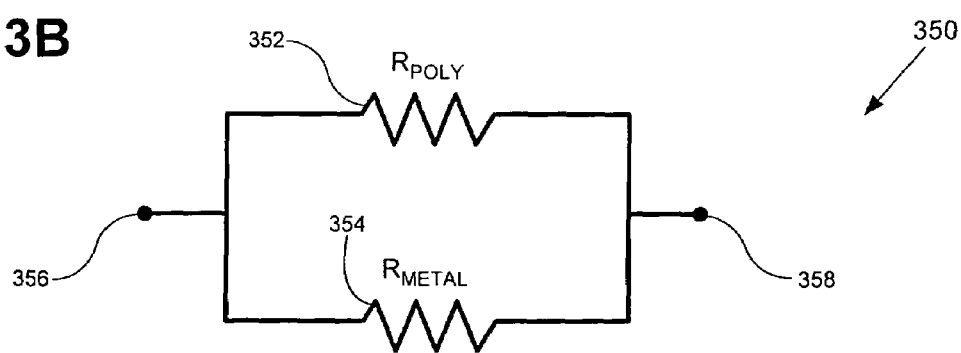
FIG. 3B illustrates a schematic diagram of an exemplary composite parallel resistor in accordance with one embodiment of the present invention.

FIG. 3B shows a schematic diagram of an exemplary composite parallel resistor in accordance with one embodiment of the present invention. Composite parallel resistor 350 in FIG. 3B includes poly resistor 352 connected in parallel with metal resistor 354. Poly resistor 352 corresponds to poly resistor 308 in FIG. 3A and metal resistor 354 corresponds to metal resistor 320 in FIG. 3A. As shown in FIG. 3B, composite parallel resistor 250 also includes terminals 356 and 358.

The mathematical derivation of the resistance of composite parallel resistor 350 follows a similar process as discussed above for composite series resistor 250 in FIG. 2B except that the equations are altered to reflect the parallel connection between poly resistor 352 and metal resistor 354. Thus, by fabricating poly resistor 352 and metal resistor 354 such that the temperature coefficient of poly resistor 352 is opposite in sign but approximately equal in value to the temperature coefficient of metal resistor 354, the difference between a resistance of composite parallel resistor 350 at a current temperature and a resistance of composite parallel resistor 350 at a reference temperature can be significantly minimized. Thus, the present invention advantageously achieves a composite parallel resistor having a resistance with a significantly minimized sensitivity to temperature variations.

Therefore, as described above, the present invention achieves a composite resistor in an IC chip having significantly reduced temperature sensitivity. Also, by forming a composite resistor by comprising a poly resistor and a metal resistor fabricated on different layers of the IC chip, the present invention advantageously achieves a composite resistor having significantly reduced temperature sensitivity without consuming additional space in the IC chip.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a temperature insensitive resistor in an IC chip has been described.

What is claimed is:

1. A composite resistor in an integrated circuit chip, said composite resistor comprising:
   a poly resistor having a first terminal and a second terminal, said poly resistor being situated over an oxide region in said integrated circuit chip, said second terminal of said poly resistor being a first terminal of said composite resistor;
   a metal resistor having a first terminal and a second terminal, said metal resistor being situated over said poly resistor, said first terminal of said metal resistor being connected to said first terminal of said poly resistor, said second terminal of said metal resistor being a second terminal of said composite resistor;
   said metal resistor comprising material selected from the group consisting of titanium nitride, titanium nitride tungsten, and titanium tungsten.

2. The composite resistor of claim 1 wherein said poly resistor comprises P-type polycrystalline silicon.

3. The composite resistor of claim 1 wherein a first resistance of said composite resistor at a first temperature is substantially equal to a second resistance of said composite resistor at a second temperature.

4. The composite resistor of claim 1 wherein said metal resistor is situated in a first metal level of said integrated circuit chip.

5. The composite resistor of claim 1 wherein a first inter-layer dielectric is situated between said poly resistor and said metal resistor.

6. The composite resistor of claim 1 wherein said oxide region is a field oxide region.

7. The composite resistor of claim 1 wherein said first terminal of said composite resistor is connected to a first metal segment and said second terminal of said composite resistor is connected to a second metal segment.

8. The composite resistor of claim 7 wherein said first and said second metal segments are situated in a second metal level of said integrated circuit chip.

9. A composite resistor in an integrated circuit chip, said composite resistor comprising:
   a poly resistor having a first terminal and a second terminal, said poly resistor being situated over an oxide region in said integrated circuit chip, said second terminal of said poly resistor being a first terminal of said composite resistor;
   a metal resistor having a first terminal and a second terminal, said metal resistor being situated over said poly resistor, said first terminal of said metal resistor being connected to said first terminal of said poly resistor, said second terminal of said metal resistor being a second terminal of said composite resistor;
   wherein said first terminal of said composite resistor is connected to a first metal segment and said second terminal of said composite resistor is connected to a second metal segment.

10. The composite resistor of claim 9 wherein said first and said second metal segments are situated in a second metal level of said integrated circuit chip.

11. A composite resistor in an integrated circuit chip, said composite resistor comprising:
   a poly resistor having a first terminal and a second terminal, said poly resistor being situated over an oxide region in said integrated circuit chip, said second terminal of said poly resistor being a first terminal of said composite resistor;
   a metal resistor having a first terminal and a second terminal, said metal resistor being situated over said poly resistor, said first terminal of said metal resistor being connected to said first terminal of said poly resistor, said second terminal of said metal resistor being a second terminal of said composite resistor;
   wherein said metal resistor comprises titanium nitride.

* * * * *